United States Patent
Chou et al.

(10) Patent No.: US 9,369,208 B2
(45) Date of Patent: Jun. 14, 2016

(54) OPTICAL COMMUNICATION MODULE

(71) Applicant: OptoMedia Technology Inc., Hsinchu County (TW)

(72) Inventors: Hui-Tsuo Chou, Hsinchu County (TW); Tung Lou Lin, Hsinchu County (TW); Hsieh Yi Chou, Hsinchu County (TW)

(73) Assignee: OPTOMEDIA TECHNOLOGY INC., Hsinchu County (TW)

( * ) Notice: Subject to any disclaimer, the term of this patent is extended or adjusted under 35 U.S.C. 154(b) by 0 days.

(21) Appl. No.: 14/624,766

(22) Filed: Feb. 18, 2015

(65) Prior Publication Data

US 2015/0244465 A1  Aug. 27, 2015

Related U.S. Application Data

(60) Provisional application No. 61/943,074, filed on Feb. 21, 2014.

(51) Int. Cl.
*G02B 7/04* (2006.01)
*H04N 5/225* (2006.01)
(Continued)

(52) U.S. Cl.
CPC .............. *H04B 10/501* (2013.01); *G02B 6/428* (2013.01); *G02B 6/4292* (2013.01); *H04B 10/60* (2013.01); *H05K 3/301* (2013.01); *G02B 6/0066* (2013.01); *G02B 6/0083* (2013.01); *G02B 6/426* (2013.01); *G02B 6/4249* (2013.01); *G11B 7/0933* (2013.01); *G11B 7/0935* (2013.01);
(Continued)

(58) Field of Classification Search
CPC ...................... G11B 7/08582; G11B 11/10515; G11B 11/10532; G11B 11/10534; G11B 11/10541; G11B 11/10543; G11B 11/10554; G11B 11/10563; G11B 11/10569; G11B 11/1058; G11B 11/10595; G11B 2007/13727; G11B 7/082; G11B 7/1359; G11B 7/1376; G11B 7/13925; G11B 7/1398; G02B 19/0014; G02B 19/0052; G02B 7/028; G02B 6/4249; G02B 6/426; G02B 6/428; G02B 6/4292; G02B 26/0875; G02B 7/023; G02B 7/04; G02B 7/08; B81B 3/0051; H01S 3/005; H02K 41/0354; H02K 41/0356; H02N 1/008; H04B 10/2572; H04B 10/501; H04B 10/60; H05K 2201/09163; G03B 9/08; G06K 2207/1013; G06K 7/10683; G06K 7/10801; H04N 5/2251; H04N 5/2257; H04N 5/23212

See application file for complete search history.

(56) References Cited

U.S. PATENT DOCUMENTS 5,095,477 A * 3/1992 Shimozawa ......... G11B 7/1378
                                                              250/201.5
6,141,300 A * 10/2000 Getreuer ............ G11B 7/08582
                                                              369/44.14

(Continued)

*Primary Examiner* — Dionne H Pendleton
(74) *Attorney, Agent, or Firm* — Chun-Ming Shih (57) ABSTRACT

An optical signal emitter includes a transmitting lens; a lens supporting portion, extending from an edge of the transmitting lens to defined a containing space surrounded by the transmitting lens and the lens supporting portion; a lens carrier, for carrying the transmitting lens and the lens supporting portion, wherein a coupling surface is defined on the lens carrier and at least a part of the lens supporting portion is coplanar with the lens carrier with respect to the coupling surface; a light transmitter, disposed in the containing space and coaxially with the transmitting lens, so as to define an light transmission path for light passing through coupling surface by an alignment between the light transmitter and the transmitting lens; at least one engagement portion, disposed on the coupling surface; at least one magnet, disposed on the lens carrier.

26 Claims, 5 Drawing Sheets

(51) Int. Cl.
 *G06K 7/10* (2006.01)
 *H04B 10/50* (2013.01)
 *G02B 6/42* (2006.01)
 *H04B 10/60* (2013.01)
 *H05K 3/30* (2006.01)
 *G11B 7/09* (2006.01)
 *G11B 7/1392* (2012.01)
 *F21V 8/00* (2006.01)
 *H05K 3/34* (2006.01)

(52) U.S. Cl.
 CPC ............ *G11B7/13925* (2013.01); *H05K 3/303* (2013.01); *H05K 3/3405* (2013.01); *H05K 2201/09163* (2013.01); *H05K 2201/10121* (2013.01); *H05K 2201/10151* (2013.01); *H05K 2201/10303* (2013.01)

(56) References Cited

U.S. PATENT DOCUMENTS

| | | | |
|---|---|---|---|
| 6,798,729 B1* | 9/2004 | Hurst, Jr. | B81B 3/0051 369/119 |
| 2005/0030841 A1* | 2/2005 | Lee | G11B 7/08582 369/44.15 |
| 2006/0114580 A1* | 6/2006 | Mori | G02B 7/028 359/819 |

* cited by examiner

OPTICAL COMMUNICATION MODULE

CROSS-REFERENCE TO RELATED APPLICATIONS

This application claims an invention which was disclosed in Provisional Application No. 61/943,074, filed on Feb. 21, 2014, entitled "Non-contacting optical transmission interface, opto-electronic device packaging and opto-electronic module". The benefit under 35 USC §119(e) of the United States provisional application is hereby claimed, and the aforementioned application is hereby incorporated herein by reference.

BACKGROUND

1. Technical Field

This disclosure relates to an optical communication module, more particularly, to an optical communication module including a self-aligned engagement between transmitting lens and the receiving lens.

2. Related Art

In dealing with data transmission, a large amount of information is spread out quickly between physical and virtual world with the increasing popularity of internet technology and computer technology in daily life. People often use electrical connectors for data transmission among different electronic devices by a physical access. An electrical connector such as a USB connector has electrical pins physically connected to other pins, so as to connect one electronic device to another.

Frequently plugging and un-plugging operation of these electrical connectors will inevitably cause a structural damage to these electrical connectors, which leading an irreparable loss of important data during data transmission or reducing lifetime of the electrical connectors.

Wireless data transmission, such as IR, Bluetooth and Wi-Fi transmission, solves above drawbacks with a non-contacting interface instead of frequently prevailing electrical connectors. However, wireless data transmission is also not suitable for a large amount of data transmission due to the limitation on data rate for large files. It will take much time to transmit a relatively large file via these wireless transmissions between one electronic device to another. Furthermore, data security and power consumption are technical issues to be solved of wireless data transmission.

SUMMARY

This disclosure provides a non-contacting optical transmission interface. The optical transmission interface provides high data rate with a non-contact transmission, and is a solution to the above-mentioned issues. The optical communication module includes a self-aligned engagement between transmitting lens and the receiving lens, the assembly engagement is physically self-aligned to improve flexibility and accuracy of the system module.

An optical signal emitter according to at least one embodiment of this discourse includes a transmitting lens; a lens supporting portion, extending from an edge of the transmitting lens to defined a containing space surrounded by the transmitting lens and the lens supporting portion; a lens carrier, for carrying the transmitting lens and the lens supporting portion, wherein a coupling surface is defined on the lens carrier and at least a part of the lens supporting portion is coplanar with the lens carrier with respect to the coupling surface; a light transmitter, disposed in the containing space and coaxially with the transmitting lens, so as to define an light transmission path for light passing through coupling surface by an alignment between the light transmitter and the transmitting lens; at least one engagement portion, disposed on the coupling surface; and at least one magnet, disposed on the lens carrier.

An optical signal receiver according to at least one embodiment of this discourse includes a receiving lens; a lens supporting portion, extending from an edge of the receiving lens to defined a containing space surrounded by the receiving lens and the lens supporting portion; a lens carrier, for carrying the receiving lens and the lens supporting portion, wherein a coupling surface is defined on the lens carrier and at least a part of the lens supporting portion is coplanar with the lens carrier with respect to the coupling surface; a light receiver, disposed in the containing space coaxially with the receiving lens, so as to define an light transmission path for light passing through coupling surface by an alignment between the light receiver and the receiving lens; at least one engagement portion, disposed on the coupling surface; and at least one magnet, disposed on the lens carrier.

An optical communication module according to at least one embodiment of this discourse includes an optical signal emitter and an optical signal receiver.

The optical signal emitter includes a transmitting lens; a transmitting lens supporting portion, extending from an edge of the transmitting lens to defined a first containing space surrounded by the transmitting lens and the transmitting lens supporting portion; a transmitting lens carrier, for carrying the transmitting lens and the transmitting lens supporting portion, wherein a first coupling surface is defined on the transmitting lens carrier and at least a part of the transmitting lens supporting portion is coplanar with the transmitting lens carrier with respect to the first coupling surface; a light transmitter, disposed in the first containing space and coaxially with the transmitting lens, so as to define an first light transmission path for light passing through the first coupling surface by an alignment between the light transmitter and the transmitting lens; and at least one first engagement portion, disposed on the first coupling surface; and at least one first magnet, disposed on the transmitting lens carrier; and The optical signal receiver includes a receiving lens; a receiving lens supporting portion, extending from an edge of the receiving lens to defined a second containing space surrounded by the receiving lens and the lens supporting portion; a receiving lens carrier, for carrying the receiving lens and the receiving lens supporting portion, wherein a second coupling surface is defined on the receiving lens carrier and at least a part of the receiving lens supporting portion is coplanar with the receiving lens carrier with respect to the second coupling surface; a light receiver, disposed in the second containing space coaxially with the receiving lens, so as to define an second light transmission path for light passing through the second coupling surface by an alignment between the light receiver and the receiving lens; at least one second engagement portion, disposed on the second coupling surface; and at least one second magnet, disposed on the receiving lens carrier;

Wherein the optical communication module is arranged such that the first engagement portion is used to engage the second engagement portion, and the first magnet is used to attract the second magnet, for having the first coupling surface to face the second coupling surface and having the first light transmission path and the second light transmission path coincide with each other.

Through the above technical approaches, the accurate alignment of the optical communication module is achieved by mechanical engagement to ensure bandwidth quality of optical communication; furthermore, the non-contacting interface prevents outside dust from shielding the optical transmitting paths for an internal lens group of optical transceivers integrated by designs of optical lens.

According to the high-throughput optical transmission, the accurate optical alignment is required to ensure optical quality of optical transmission interface along a set of an optical transmitting path between a transmitter and a receiver. The embodiments of the transmitting lens and receiving lens of the non-contacting optical transmission interface of this disclosure will be described hereinafter.

The following embodiments will be described in detail on the above description and the technical solution of this disclosure.

BRIEF DESCRIPTION OF THE DRAWINGS

This disclosure will become more fully understood from the detailed description given herein below for illustration only, and thus not limitative of this disclosure, wherein.

DETAILED DESCRIPTION

First Embodiment

Figure 1:
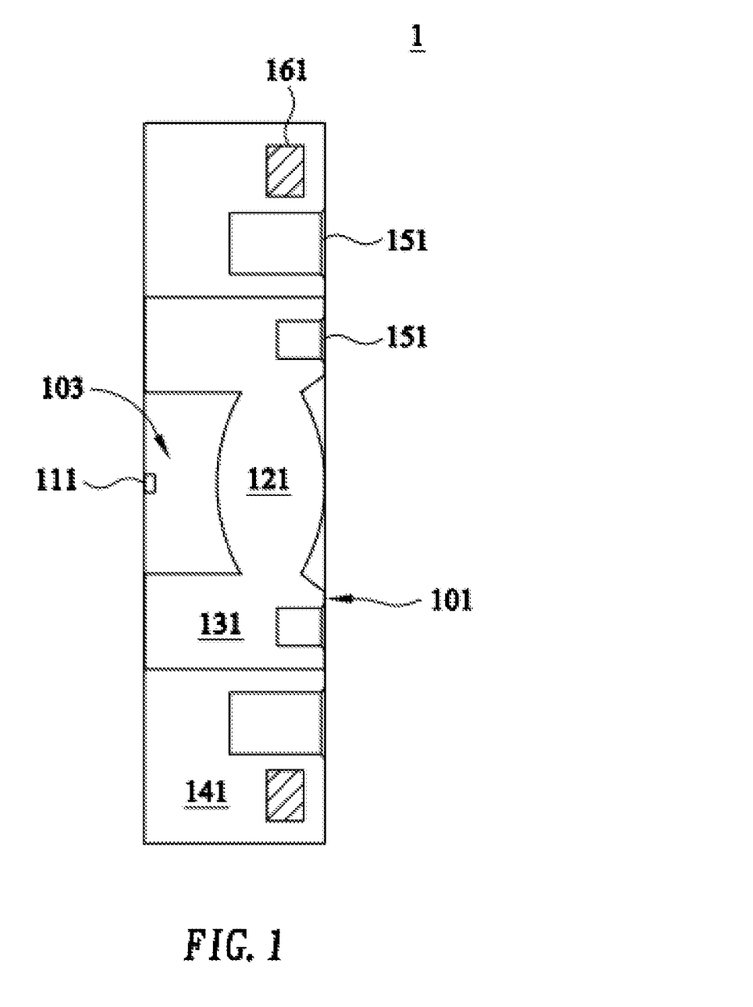
FIG. 1 is a schematic structural view of the optical signal emitter.

FIG. 1 is a schematic structural view of an optical signal emitter 1 for emitting optical signal in the optical communication. The optical signal emitter 1 includes a transmitting lens 121, lens supporting portion 131, a lens carrier 141, and a light transmitter 111.

The lens supporting portion 131 extends from an edge of the transmitting lens 121, so as to define a containing space 103 surrounded by the sides of the transmitting lens 121 and the lens supporting portion 131, and the light transmitter 111 is disposed inside the containing space 103. The containing space 103 can be further filled with at least one dielectric material, which the dielectric material is air, Polyetherimide (PEI), Polymethylmethacrylate (PMMA), epoxy, glue or glass.

The lens carrier 141 is used for carrying the transmitting lens 121 and the lens supporting portion 131. A coupling surface 101 is defined on the lens carrier 141 and at least a part of the lens supporting portion 131 is coplanar with the lens carrier 141 with respect to the coupling surface 101.

The transmitting lens 121 is not allowed to exceed the coupling surface 101 to prevent collision with another optical transceiver without contacting. And, the lens supporting portion 131 and the lens carrier 141 form a housing to protect the light transmitter 111 and transmitting lens 121.

The optical signal emitter 1 further includes engagement portions 151 and magnets 161. The engagement portions 151 are disposed on the coupling surface 101, more particularly the engagement portions 151 are disposed on the lens supporting portion 131 and the lens carrier 141 and located on the coupling surface 101. In this embodiment, each of the engagement portions 151 is a positioning slot, and the positioning slot can be altered by a positioning pin. And the magnets 161 are disposed on the lens carrier 141 and located near the coupling surface 101.

The light transmitter 111 is disposed coaxially with the transmitting lens 121, so as to define a light transmission path 151 for light passing through coupling surface 101. The light transmission path 151 is defined by an alignment from the center of the light transmitter 111 to the center of the transmitting lens 121 in the containing space 103. In first embodiment, the transmitting lens 121 collimates light from light transmitter 111 out of the surface 101 by the light transmission path 151.

Second Embodiment

Figure 2:
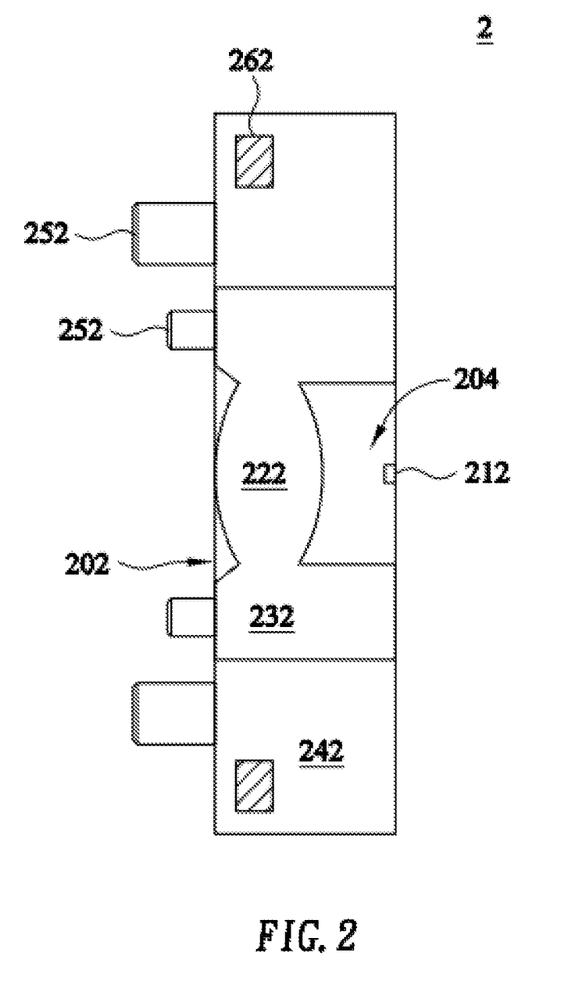
FIG. 2 is a schematic structural view of the optical signal receiver.

FIG. 2 is a schematic structural view of an optical signal receiver 2 for receiving optical signal in the optical communication. The optical signal receiver 2 includes receiving lens 222, lens supporting portion 232, a lens carrier 242, and a light receiver 212.

The difference between the first embodiment and the second embodiment is that in the second embodiment, the optical signal receiver 2 is suitable for receiving optical signal from the light transmitter 111 of the first embodiment through the transmitting lens 121 and receiving lens 222.

The lens supporting portion 232 extends from an edge of the receiving lens 222, so as to define a containing space 204 surrounded by the sides of the receiving lens 222 and the lens supporting portion 232, and the light receiver 212 is disposed inside the containing space 204. The containing space 204 can be further filled with at least one dielectric material, which the dielectric material is air, Polyetherimide (PEI), Polymethylmethacrylate (PMMA), epoxy, glue or glass.

The lens carrier 242 is used for carrying the receiving lens 222 and the lens supporting portion 232. A coupling surface 202 is defined on the lens carrier 242 and at least a part of the lens supporting portion 231 is coplanar with the lens carrier 242 with respect to the coupling surface 202.

The receiving lens 222 is not allowed to exceed the coupling surface 202 to prevent collision with another optical transceiver without contacting. And, the lens supporting portion 232 and the lens carrier 242 form a housing to protect the light receiver 212 and receiving lens 222.

The optical signal receiver 2 further includes engagement portions 252 and magnets 262. The engagement portions 252 are disposed on the coupling surface 202, more particularly the engagement portions 252 are disposed on the lens supporting portion 232 and the lens carrier 242 and located on the coupling surface 202. In this embodiment, each of the engagement portions 252 is a positioning pin, and the positioning pin can be altered by a positioning slot. And the magnets 262 are disposed on the lens carrier 242 and located near the coupling surface 202.

The light receiver 212 is disposed coaxially with the receiving lens 222, so as to define a light transmission path 252 for light entering into containing space 204 by passing through the coupling surface 202. The light transmission path 252 is defined by an alignment from the center of the light receiver 212 to the center of the receiving lens 222 in the containing space 204. In second embodiment, the receiving lens 222 focuses light on light receiver 212 into the surface 202 by the light transmission path 252.

Third Embodiment

Figure 3:
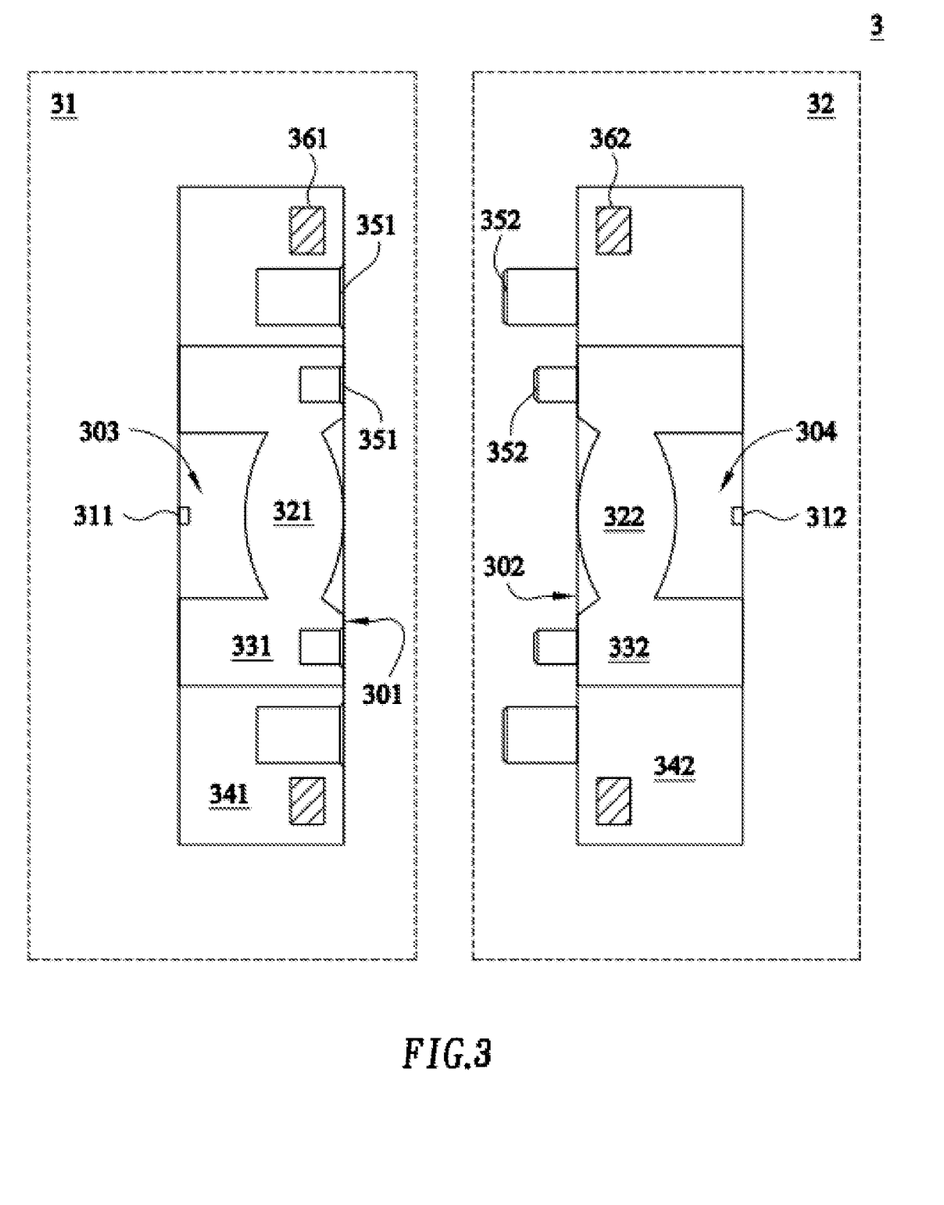
FIG. 3 is a schematic structural view of the optical communication module.

FIG. 3 is a schematic structural view of the optical communication module 3 according to a third embodiment of this disclosure. The optical communication module 3 includes an optical signal emitter 31 and an optical signal receiver 32, in which the optical signal emitter 31 is identical to the optical signal emitter 1 as described in the first embodiment and the optical signal receiver 32 is identical to the optical signal receiver 2 as describe in the second embodiment.

The optical signal emitter 31 and the optical signal receiver 32 are able to be assembled together by a mechanical self-alignment to transmit optical signal and to form a part of the optical communication 3. For example, when the optical communication module 3 is integrated with USB plug connectors, the optical signal emitter 31 and the optical signal receiver 32 are internal components for data transmission.

The optical signal emitter 31 includes a transmitting lens 321, a transmitting lens supporting portion 331, a transmitting lens carrier 341, and a light transmitter 311.

The transmitting lens supporting portion 331 extends from an edge of the transmitting lens 321 to defined a first containing space 303 surrounded by the transmitting lens 321 and the transmitting lens supporting portion 331. A first coupling surface 301 is defined on the transmitting lens carrier 341 and at least a part of the transmitting lens supporting portion 331 is coplanar with the transmitting lens carrier 341 with respect to the first coupling surface 301. The transmitting lens 321 does not exceed the first coupling surface 301 to prevent the transmitting lens 321 from being collided during the engagement of the optical signal emitter 31 and the optical signal receiver 32. More, a transmitting lens carrier 341 is arranged adjacent to and coplanar with the first supporting portion 331 along the first coupling surface 301 to protect the light transmitter 311 and the transmitting lens 321 with the first supporting portion 331. The first containing space 303 can be further filled with at least one dielectric material, which the dielectric material is air, Polyetherimide (PEI), Polymethylmethacrylate (PMMA), epoxy, glue or glass.

Similarly, the optical signal receiver 32 includes a receiving lens 322, a second supporting portion 332, a receiving lens carrier 342, and a light receiver 312.

The second supporting portion 332 extends from an edge of the receiving lens 322 to define a second containing space 304 surrounded by the receiving lens 322 and the second supporting portion 332. A second coupling surface 302 is defined on the receiving lens supporting portion 332 and at least a part of the receiving lens supporting 332 is coplanar with the receiving lens carrier 342 with respect to the second coupling surface 302. The receiving lens 322 does not exceed the second coupling surface 302 to avoid the receiving lens 322 from any collision during the engagement of the optical signal emitter 31 and the optical signal receiver 32. A second supporting portion 332 and a receiving lens carrier 342 are lens housing to protect the light receiver 312 and receiving lens 322. And, the first coupling surface 301 and the second coupling surface 302 are one pair of opposite parallel surfaces between which an air gap exists as a dielectric constant. The second containing space 304 can be further filled with at least one dielectric material, which the dielectric material is air, Polyetherimide (PEI), Polymethylmethacrylate (PMMA), epoxy, glue or glass.

Optical signal is emitted from the light transmitter 311 and travels along an optical path 350 to the light receiver 312. The transmitting lens 321 collimates the light (optical signal) on the optical path 350 and then the receiving lens 322 focuses the light from the optical path 350. It is allowed to alter each the transmitting lens 321 and the receiving lens 322 to change effective focal length associated with the lens body for realizing the optical path. The transmitting lens 321 and the receiving lens 322 according to this disclosure include spherical lenses, aspherical lenses or lenticular lenses with desired focal lengths.

As shown in FIG. 3, the optical signal receiver 32 is mechanically coupled to the optical signal emitter 31 by the engagement portion 151, 252 in above embodiments. The engagement portion 151, 252 in first and second embodiment are respectively a first engagement portion 351 and a second engagement portion 352 in this embodiment.

The first engagement portion 351 and the second engagement portion 352 are combination of a positioning pin and a positioning slot in the third embodiment of the invention. For example, the positioning slot 351 is set in the first coupling surface 301 and the positioning pin 352 is outwardly projected from the second coupling surface 302. Specially, the design of lead angle can be taken into consideration for the positioning pin and the positioning slot to prevent collision during an engagement. Further, a first magnet 361 and a second magnet 362 provide magnetic-suction force to attract both the optical signal emitter 31 and the optical signal receiver 32 closer so that it can promote the first engagement portion 351 and the second engagement portion 352 such as the positioning slot and the positioning pin arranged at accurate position of the engagement of the optical signal emitter 31 and the optical signal receiver 32.

Therefore, through both magnetic-suction force and mechanical engagement, it can ensure the optical path 350 from the light transmitter 311 self-aligned to focus on the light receiver 312. As a result, the optical communication module 3 is provided by two assemblies combined to offer an accurate self-alignment of an optical signal emitter 31 and an optical signal receiver 32.

Totally, a set of optical paths from light transmitter 311 to light receiver 312 are subjected to the transmitting lens 321 and the receiving lens 322 with various focal lengths described in the following embodiments.

Fourth Embodiment

Figure 4:
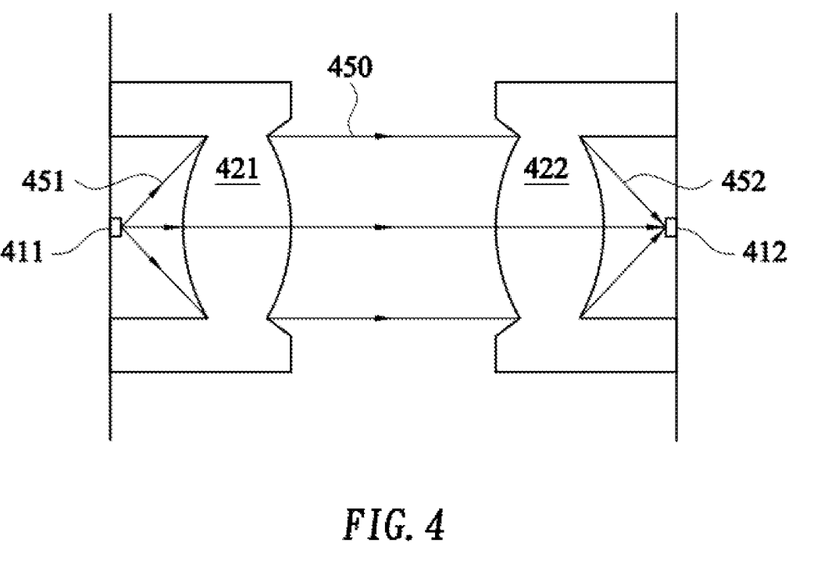
FIG. 4 is a schematic view of the Fourth Embodiment.

FIG. 4 is a fourth embodiment of the transmitting lens 421 and the receiving lens 422 of a non-contacting optical transmission interface.

The optical signal transmitted through the optical communication module 3 is emitted by a by a light transmitter 411 and received by a light receiver 412. Optical signal from the light transmitter 411 travels along a set of optical paths 451. Then, the optical signal is collimated by the transmitting lens 421 to converge light into parallel light or approximate parallel light. The parallel light delivery cross a distance between the transmitting lens 421 and receiving lens 422 as a dielectric gap along a set of optical paths 450.

Referring to FIG. 3, the dielectric gap exists between the first coupling surface 301 and the second coupling surface 302 as a dielectric constant, and an air gap or a dielectric material of a predicted refractive index can be applied for the gap for light transmission.

Subsequently, the optical signal passes through the receiving lens 422 and then is focused on a light receiver 412 along a set of optical paths 452. It is noted that the transmitting lens 421 and the receiving lens 422 can be, but are not limited to, spherical lenses, aspherical lenses, or lenticular lenses.

In the fourth embodiment, the alignment accuracy of the transmitting lens 421 and the receiving lens 422 for the optical paths 450 can be achieved by the above mechanical engagement of the third embodiment, and then the light through the receiving lens 422 can be robustly focused on the light receiver 412.

Fifth Embodiment

Figure 5:
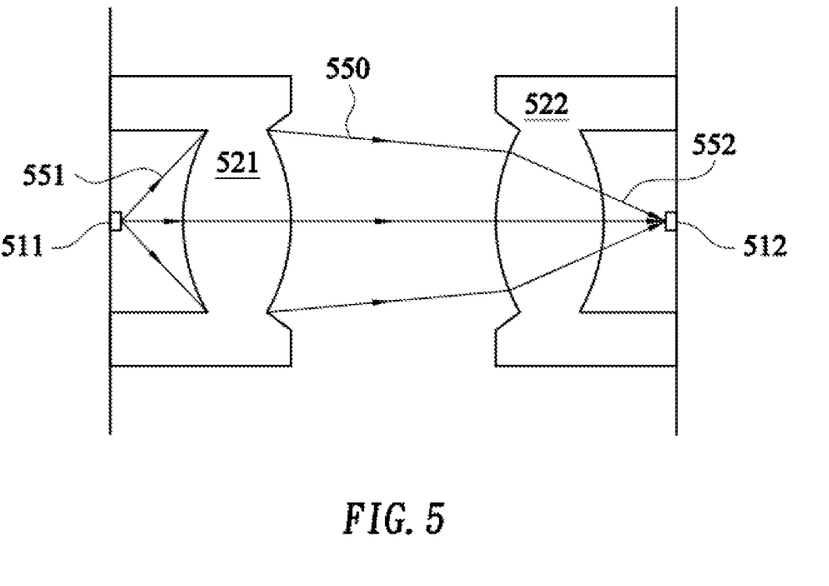
FIG. 5 is a schematic view of the Fifth Embodiment.

FIG. 5 is a fifth embodiment of the transmitting lens 521 and the receiving lens 522 of the non-contacting optical transmission interface.

The difference between the fourth embodiment and the fifth embodiment is that the focal length of the transmitting lens 521 is longer than the receiving lens 522 as shown in FIG. 5. The optical signal transmitted through the optical communication module 3 is emitted by a light transmitter 511 and received by a light receiver 512. Optical signal from the light transmitter 511 travels along a set of optical paths 551.

Then, the optical signal is collimated by the transmitting lens 521 to converge light, which the focus of the optical paths 550 will be located opposite to and away from the receiving lens 522 along a set of optical paths 552. The light through the transmitting lens 521 delivery cross a distance between the transmitting lens 521 and receiving lens 522 as a dielectric gap along a set of optical paths 550.

Referring to FIG. 3, the dielectric gap exists between the first coupling surface 301 and the second coupling surface 302 as a dielectric constant, and an air gap or a dielectric material of a predicted refractive index can be applied for the gap for light transmission.

Subsequently, the optical signal passes through the receiving lens 522 and then is focused on a light receiver 512 along a set of optical paths 552. It is noted that the transmitting lens 521 and the receiving lens 522 can be, but are not limited to, spherical lenses, aspherical lenses, or lenticular lenses.

In the fifth embodiment, the alignment accuracy of the transmitting lens 521 and the receiving lens 522 for the optical paths 550 can be achieved by the above mechanical engagement of the third embodiment, and then the light through the receiving lens 522 can be robustly focused on the light receiver 512.

Sixth Embodiment

Figure 6:
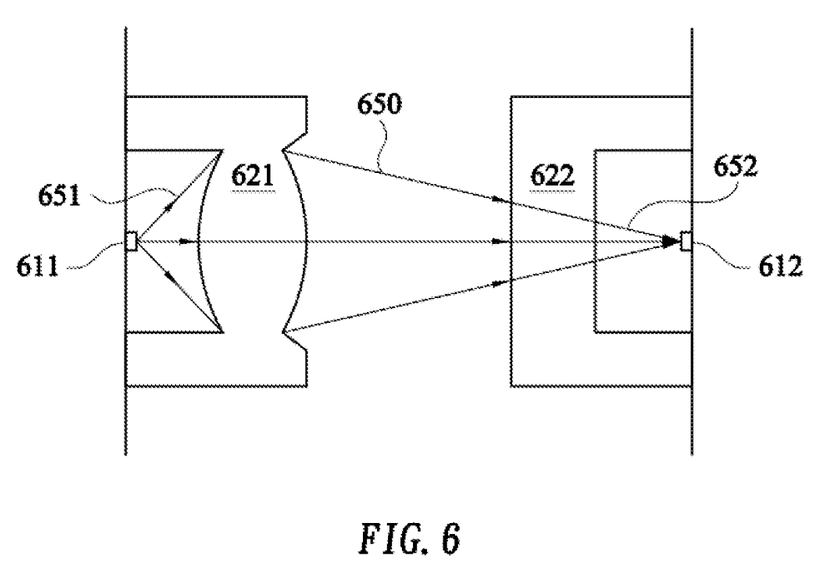
FIG. 6 is a schematic view of the Sixth embodiment.

FIG. 6 is a sixth embodiment of the transmitting lens 621 and the receiving lens 622 of a non-contacting optical transmission interface.

The difference between the fourth embodiment and the sixth embodiment is that a receiving lens 622 is a planar lens as a receiving lens with parallel planar surfaces arranged in front and rear. The optical signal transmitted through the optical communication module 3 is emitted by a by a light transmitter 611 and received by a light receiver 612. Optical signal from the light transmitter 611 travels along a set of optical paths 651. Then, the optical signal is collimated by the transmitting lens 621 to converge light, which the lens 621 includes a relatively short focal length to converge more rapidly toward the focal point due to a planar receiving lens without a secondary converging light. The focus of the optical paths 650 will be mainly determined by the transmitting lens 621 as shown in FIG. 6. The light through the transmitting lens 621 delivery cross a distance between the transmitting lens 621 and receiving lens 622 as a dielectric gap along a set of optical paths 450.

Referring to FIG. 3, the dielectric gap exists between the first coupling surface 301 and the second coupling surface 302 as a dielectric constant, and an air gap or a dielectric material of a predicted refractive index can be applied for the gap for light transmission.

Subsequently, the optical signal passes through the receiving lens 622 and then is focused on a light receiver 612 along a set of optical paths 652. It is noted that the transmitting lens 621 can be, but are not limited to, spherical lenses, aspherical lenses, or lenticular lenses. And the receiving lens 622 can be, but is not limited to, a planar lens or other materials without influence on the optical paths. More importantly, it is converted primarily by the transmitting lens 621 to focus on the light receiver 612.

In the sixth embodiment, the alignment accuracy of the transmitting lens 621 and the receiving lens 622 for the optical paths 650 can be achieved by the above mechanical engagement of the third embodiment, and then the light through the receiving lens 622 can be robustly focused on the light receiver 612.

In the light spectrum, light wavelengths of 850 nm to 1650 nm fall between the ultraviolet and microwave frequencies, that it can be used as a light source in the common optical communication. Therefore, the light transmitter 111, 311, 411, 511, 611 can be single-mode optical fibers as coherent laser sources, and the light receiver 212, 312, 412, 512, 612 can also be single-mode optical fibers. Further, the light transmitter 111, 311, 411, 511, 611 can be a LED to activate a light as a non-coherent light source, and the light receiver 212, 312, 412, 512, 612 can be a photodetector to receive a light as a light collector.

In summary, an optical communication module includes an optical signal emitter and an optical signal receiver self-aligned by the engagement of a positioning pin and a positioning slot with suction of magnets. And, the optical signal receiver is mechanically coupled to the optical transceiver to ensure the light transmission from a light transmitter to a light receiver along an optical transmission path through a transmitting lens of the optical transceiver and a receiving lens of the optical signal receiver with the non-contacting interface.

It is believed that the present embodiments will be understood by the foregoing description and illustration. The principles and the features of the present disclosure can be employed in various embodiments thereof without departing from the scope of the disclosure as claimed. But, the above embodiments are merely to illustrate the possible scope of the disclosure, rather than to restrict the scope of the invention.

What is claimed is:

1. An optical signal emitter, comprising:
   a transmitting lens;
   a lens supporting portion, extending from an edge of the transmitting lens to define a containing space surrounded by the transmitting lens and the lens supporting portion;
   a lens carrier, for carrying the transmitting lens and the lens supporting portion, wherein a coupling surface is defined on the lens carrier and at least a part of the lens supporting portion is coplanar with the lens carrier with respect to the coupling surface;
   a light transmitter, disposed in the containing space and coaxially with the transmitting lens, so as to define an light transmission path for light passing through the coupling surface by an alignment between the light transmitter and the transmitting lens;
   at least one engagement portion, disposed on the coupling surface; and
   at least one magnet, embedded in the lens carrier and located under the coupling surface.

2. The optical signal emitter of claim 1, wherein the transmitting lens is a spherical lens, an aspherical lens or a lenticular lens.

3. The optical signal emitter of claim 1, wherein the transmitting lens collimates light.

4. The optical signal emitter of claim 1, wherein the light transmitter is a single-mode optical fiber.

5. The optical signal emitter of claim 1, wherein the light transmitter uses a LED to activate a light.

6. The optical signal emitter of claim 1, wherein the engagement portion is a positioning pin or a positioning slot.

7. The optical signal emitter of claim 6, wherein the engagement portion is disposed on the lens carrier or the lens supporting portion.

8. The optical signal emitter of claim 1, wherein the containing space is filled with at least one dielectric material.

9. The optical signal emitter of claim 8, wherein the dielectric material is air, PEI, PMMA, epoxy, glue or glass.

10. An optical signal receiver, comprising:
a receiving lens;
a lens supporting portion, extending from an edge of the receiving lens to define a containing space surrounded by the receiving lens and the lens supporting portion;
a lens carrier, for carrying the receiving lens and the lens supporting portion, wherein a coupling surface is defined on the lens carrier and at least a part of the lens supporting portion is coplanar with the lens carrier with respect to the coupling surface;
a light receiver, disposed in the containing space coaxially with the receiving lens, so as to define an light transmission path for light passing through the coupling surface by an alignment between the light receiver and the receiving lens;
at least one engagement portion, disposed on the coupling surface; and
at least one magnet, embedded in the lens carrier and located under the coupling surface.

11. The optical signal receiver of claim 10, wherein the receiving lens is a spherical lens, an aspherical lens, a lenticular lens or a planar lens.

12. The optical signal receiver of claim 10, wherein the receiving lens focuses light.

13. The optical signal receiver of claim 10, wherein the light receiver is a single-mode optical fiber.

14. The optical signal receiver of claim 10, wherein the light receiver is photodetector.

15. The optical signal receiver of claim 10, wherein the engagement portion is a positioning pin or a positioning slot.

16. The optical signal receiver of claim 15, wherein the engagement portion is disposed on the lens carrier or the lens supporting portion.

17. The optical signal emitter of claim 10, wherein the containing space is filled with at least one dielectric material.

18. The optical signal emitter of claim 17, wherein the dielectric material is air, PEI, PMMA, epoxy, glue or glass.

19. An optical communication module, comprising:
an optical signal emitter, comprising:
a transmitting lens;
a transmitting lens supporting portion, extending from an edge of the transmitting lens to defined a first containing space surrounded by the transmitting lens and the transmitting lens supporting portion;
a transmitting lens carrier, for carrying the transmitting lens and the transmitting lens supporting portion, wherein a first coupling surface is defined on the transmitting lens carrier and at least a part of the transmitting lens supporting portion is coplanar with the transmitting lens carrier with respect to the first coupling surface;
a light transmitter, disposed in the first containing space and coaxially with the transmitting lens, so as to define an first light transmission path for light passing through the first coupling surface by an alignment between the first light transmitter and the transmitting lens; and
at least one first engagement portion, disposed on the first coupling surface; and
at least one first magnet, disposed on the transmitting lens carrier; and
an optical signal receiver, comprising:
a receiving lens;
a receiving lens supporting portion, extending from an edge of the receiving lens to defined a second containing space surrounded by the receiving lens and the receiving lens supporting portion;
a receiving lens carrier, for carrying the receiving lens and the receiving lens supporting portion, wherein a second coupling surface is defined on the receiving lens carrier and at least a part of the receiving lens supporting portion is coplanar with the receiving lens carrier with respect to the second coupling surface;
a light receiver, disposed in the second containing space coaxially with the receiving lens, so as to define an second light transmission path for light passing through the second coupling surface by an alignment between the light receiver and the receiving lens;
at least one second engagement portion, disposed on the second coupling surface; and
at least one second magnet, disposed on the receiving lens carrier;
wherein the optical communication module is arranged such that the first engagement portion is used to engage the second engagement portion, and the first magnet is used to attract the second magnet, for having the first coupling surface to face the second coupling surface and having the first light transmission path and the second light transmission path coincide with each other.

20. The optical communication module of claim 19, wherein the transmitting lens and the receiving lens are spherical lenses, aspherical lenses or lenticular lenses.

21. The optical communication module of claim 19, wherein the transmitting lens collimates light and the receiving lens focuses light.

22. The optical communication module of claim 19, wherein an air gap exists between the first surface and the second surface as a dielectric constant.

23. The optical communication module of claim 19, wherein the light transmitter and the light receiver are single-mode optical fibers.

24. The optical communication module of claim 19, wherein the first engagement portion and the second engagement portion are combination of a positioning pin and a positioning slot.

25. The optical signal emitter of claim 19, wherein the first containing space and the second containing space are filled with at least one dielectric material.

26. The optical signal emitter of claim 25, wherein the dielectric material is air, PEI, PMMA, epoxy, glue or glass.

* * * * *